United States Patent
Yang et al.

(10) Patent No.: US 7,566,181 B2
(45) Date of Patent: Jul. 28, 2009

(54) CONTROLLING CRITICAL DIMENSIONS OF STRUCTURES FORMED ON A WAFER IN SEMICONDUCTOR PROCESSING

(75) Inventors: Wenge Yang, Fremont, CA (US); Alan Nolet, San Jose, CA (US)

(73) Assignee: Tokyo Electron Limited, Tokyo (JP)

( * ) Notice: Subject to any disclaimer, the term of this patent is extended or adjusted under 35 U.S.C. 154(b) by 802 days.

(21) Appl. No.: 10/933,028

(22) Filed: Sep. 1, 2004

(65) Prior Publication Data

US 2006/0046166 A1 Mar. 2, 2006

(51) Int. Cl.
- G03D 5/00 (2006.01)
- G03C 5/00 (2006.01)
- H01L 21/00 (2006.01)
- G03F 7/00 (2006.01)

(52) U.S. Cl. .................. 396/575; 396/611; 430/30; 430/311; 430/330; 438/7

(58) Field of Classification Search ............... 396/571, 396/575, 578, 611; 430/30, 330; 438/7–9, 438/16; 700/29; 237/81; 156/345.27
See application file for complete search history.

(56) References Cited

U.S. PATENT DOCUMENTS

| | | | |
|---|---|---|---|
| 6,196,734 B1 * | 3/2001 | Templeton et al. .......... 396/571 |
| 6,770,852 B1 * | 8/2004 | Steger ........................ 219/390 |
| 6,785,638 B2 | 8/2004 | Niu et al. | |
| 6,943,900 B2 | 9/2005 | Niu et al. | |
| 7,030,957 B2 * | 4/2006 | Dishon et al. ................. 355/27 |
| 7,075,031 B2 * | 7/2006 | Strang et al. ........... 219/121.52 |
| 7,330,279 B2 * | 2/2008 | Vuong et al. ................ 356/625 |
| 2003/0002878 A1 * | 1/2003 | Singh et al. ................. 396/611 |
| 2003/0166305 A1 * | 9/2003 | Shinya et al. .................. 438/7 |
| 2004/0173311 A1 * | 9/2004 | Ichimaru et al. ....... 156/345.27 |
| 2004/0267397 A1 | 12/2004 | Doddi et al. | |
| 2005/0267606 A1 * | 12/2005 | Bartlett et al. ................ 700/29 |
| 2006/0196960 A1 * | 9/2006 | Yu et al. ....................... 237/81 |

* cited by examiner

*Primary Examiner*—William B Perkey

(57) ABSTRACT

In semiconductor processing, the critical dimensions of structures formed on a wafer are controlled by first developing photoresist on top of a film layer on a wafer using a developer tool, the photoresist development being a function of developer tool process variables including temperature and length of time of development. After developing the photoresist, one or more etching steps are performed on the film layer on the wafer using an etch tool. After the one or more etching steps are performed, critical dimensions of structures at a plurality of locations on the wafer are measured using an optical metrology tool. After the critical dimensions are measured, one or more of the developer tool process variables are adjusted based on the critical dimensions of structures measured at the plurality of locations on the wafer.

24 Claims, 5 Drawing Sheets

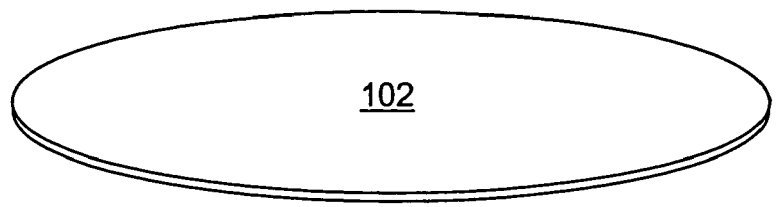
Fig. 1
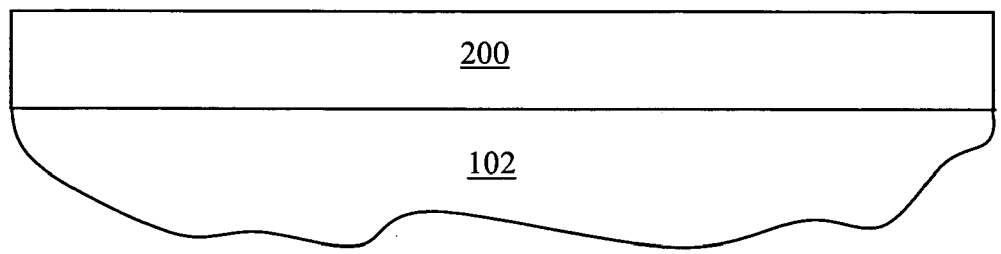
Fig. 2-A
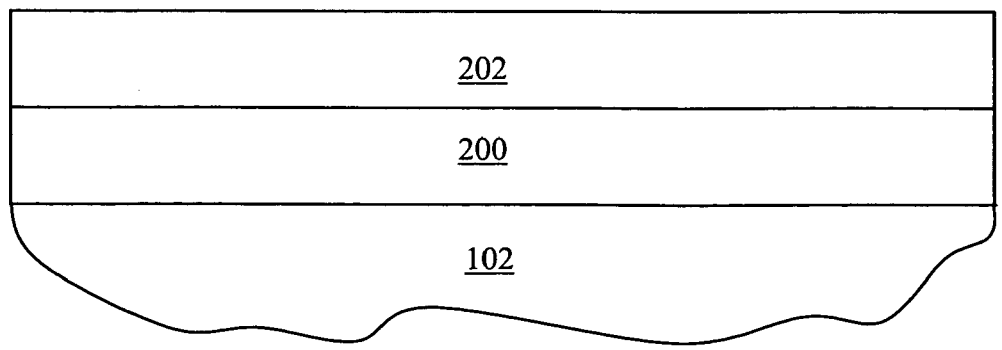
Fig. 2-B

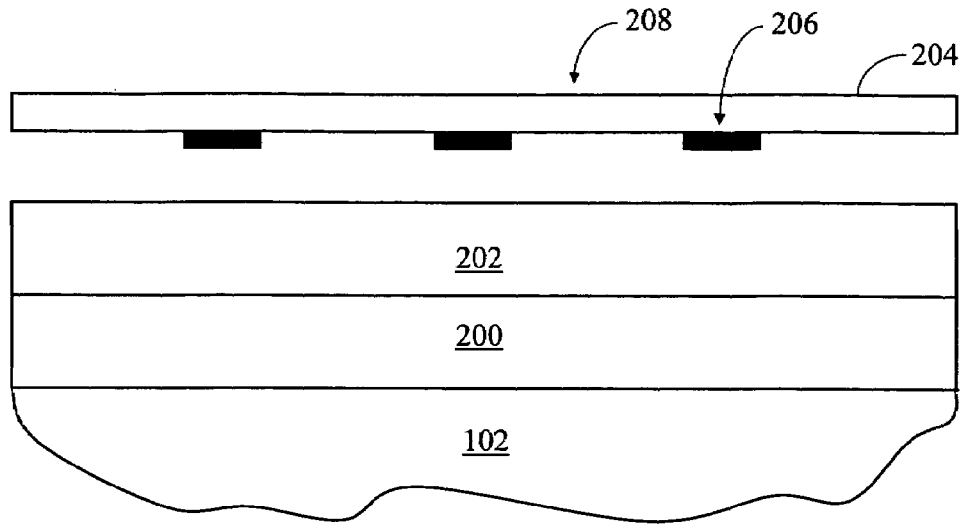
*Fig. 2-C*
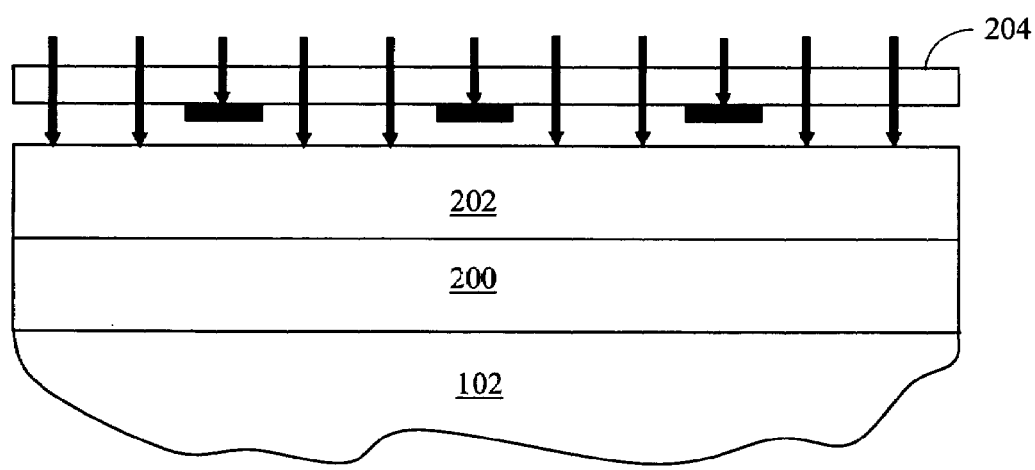
*Fig. 2-D*

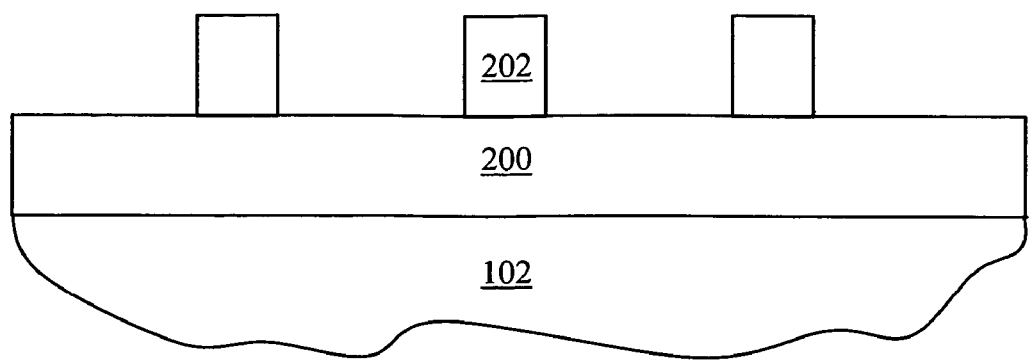
*Fig. 2-E*
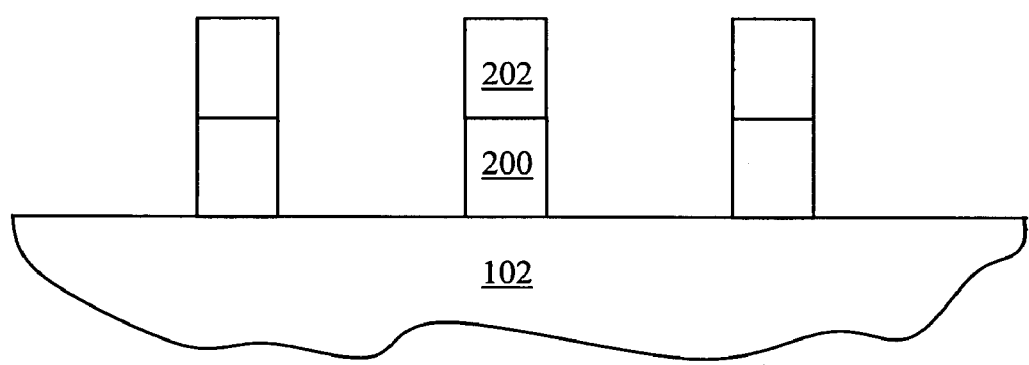
*Fig. 2-F*

CONTROLLING CRITICAL DIMENSIONS OF STRUCTURES FORMED ON A WAFER IN SEMICONDUCTOR PROCESSING

BACKGROUND

1. Field

The present application relates to semiconductor processing, and more particularly to controlling critical dimensions of structures formed on a wafer.

2. Related Art

In semiconductor processing, semiconductor devices/circuits are formed on a wafer by depositing and patterning layers of materials. In general, the features of the devices/circuits are formed onto the layers of deposited materials using a patterning process.

In a conventional patterning process, a photoresist layer is deposited on top of a film layer on which the features of the devices/circuits are to be formed. A photomask with a layout of the features of the devices/circuits is positioned over the photoresist, then exposed to light. A developing solution is used to dissolve the portions of the photoresist either exposed or not exposed to the light through the photomask. An etching system is then used to strip the portions of the film layer not protected by the photoresist. In this manner, the features on the photomask are formed as structures on the film layer.

Non-uniformities associated with the patterning process, however, can produce undesirable variations in the critical dimensions of the structures formed by the patterning process. For example, the resist development and conventional etching tools used in the patterning process, such as plasma dry etchers, typically produce non-uniform variations in the critical dimensions of structures from the center to edge of a wafer. Correcting for the non-uniform variations in conventional etching tools can be difficult.

SUMMARY

In an exemplary embodiment, the critical dimensions of structures formed on a wafer are controlled by first developing photoresist on top of a film layer on a wafer using a developer tool, the photoresist development being a function of developer tool process variables including temperature and length of time of development. After developing the photoresist, one or more etching steps are performed on the film layer on the wafer using an etch tool. After the one or more etching steps are performed, critical dimensions of structures at a plurality of locations on the wafer are measured using an optical metrology tool. After the critical dimensions are measured, one or more of the developer tool process variables are adjusted based on the critical dimensions of structures measured at the plurality of locations on the wafer.

DESCRIPTION OF DRAWING FIGURES

The present application can be best understood by reference to the following description taken in conjunction with the accompanying drawing figures, in which like parts may be referred to by like numerals:

FIG. 1 depicts an exemplary wafer;

FIGS. 2-A to 2-F depict an exemplary deposition and patterning process;

DETAILED DESCRIPTION

The following description sets forth numerous specific configurations, parameters, and the like. It should be recognized, however, that such description is not intended as a limitation on the scope of the present invention, but is instead provided as a description of exemplary embodiments.

With reference to FIG. 1, as discussed earlier, the process of forming features of semiconductor devices/circuits as structures on wafer 102 includes depositing and patterning layers of materials on wafer 102. More particularly, the features of the semiconductor devices/circuits are formed as structures one layer at a time by depositing a layer of material, then removing portions of the deposited layer of material.

The process of depositing the layers of material is generally referred to as a deposition process. Exemplary deposition processes include chemical vapor deposition (CVD), oxidation, spin coating, sputtering, and the like. Exemplary materials that are deposited include poly, oxides, metals, and the like.

The process of forming features on the deposited layers of materials is generally referred to as a patterning process, which typically includes a photolithography process and an etching process. More particularly, in a typical lithographic process, the features of the semiconductor device/circuit are laid out one layer at a time on a series of photomasks. A single photomask typically includes the layout for one layer of one or more chips throughout wafer 102.

With reference now to FIGS. 2-A through 2-F, an exemplary deposition and patterning process is depicted. It should be noted that the following description is intended to be illustrative rather than comprehensive. As such, the deposition and patterning process can include fewer or more process steps.

With reference to FIG. 2-A, a film layer 200 is deposited on wafer 102. As noted earlier, film layer 200 can include various materials, such as poly, oxides, metals, and the like. It should be noted that film layer 200 can be deposited on top of a subsequent layer rather than directly on wafer 102.

Figure 3:
FIGS. 3 and 4 depict exemplary tools used in the exemplary deposition and patterning process.

With reference to FIG. 2-B, a photoresist layer 202 is deposited on top of film layer 200. It should be noted that photoresist layer 202 can be deposited directly on top of wafer 102 rather than on material layer 200. With reference to FIG. 3, a coater tool 302 can be used to deposit photoresist layer 202 (FIG. 2-B).

With reference to FIG. 2-C, a photomask 204 is positioned above wafer 102, film layer 200 and photoresist layer 202. Photomask 204 includes portions 206 that block light and portions 208 that transmit light. Portions 206 of photomask 204 that block light can be patterned to have the same shape as the structures that are to be formed. These types of photomasks are generally referred to as "light field" masks. Alternatively, portions 208 of photomask 204 that transmit light can be patterned to have the same shape as the structures that are to be formed. These types of photomasks are generally referred to as "dark field" masks. For the sake of convenience and clarity, photomask 204 is depicted and described as being a "light field" mask.

With reference to FIG. 2-D, photomask 204 is aligned relative to wafer 102 such that the structures that are to be formed are positioned in the proper intended location. When photomask 204 is properly aligned, photomask 204 and portions of photoresist 202 are exposed to light. As depicted in FIG. 2-D, only certain portions of photoresist 202 are exposed to the light, i.e., the portions under portions 208 (FIG. 2-C) of photomask 204 that transmit light. With reference to FIG. 3, a stepper tool 304 can be used to position and expose photomask 204 (FIG. 2-C).

With reference again to FIG. 2-D, in this example, photoresist layer 202 has the material characteristic that its solubility is responsive to exposure to light. More particularly, some photoresist change from a soluble to an insoluble condition when exposed to light. These types of photoresist are generally known as "negatively acting" resist. In contrast, some photoresist change from an insoluble to a soluble condition when exposed to light. These types of photoresist are generally known as "positively acting" resist.

For the sake of convenience and clarity, assume that photoresist layer 202 is a "positively acting" resist. As such, with reference now to FIG. 2-E, when photoresist layer 202 is exposed to an appropriate chemical solvent (i.e., a developer), the portions of photoresist layer 202 that were exposed to the light are dissolved. With reference to FIG. 3, a developer tool 306 can be used to develop photoresist layer 202 (FIG. 2-E), with the photoresist development being a function of developer tool process variables including temperature and length of time of development.

With reference now to FIG. 2-F, film layer 200 is then etched to remove the portions of film layer 200 not protected by photoresist layer 202. It should be noted that multiple etching steps can be used. With reference to FIG. 3, an etch tool 308 can be used to etch film layer 200.

With reference again to FIG. 2-F, in one exemplary embodiment, after film layer 200 has been etched, critical dimensions of the structures formed on wafer 102 are measured at a plurality of locations on wafer 102. A profile of critical dimension measurements across the wafer can be generated based on the critical dimension measurements at the plurality of locations. In the present example, the structures formed on wafer 102 include the remaining portions of film layer 200 and photoresist layer 202. In the present exemplary embodiment, the measured critical dimensions can include width (e.g., top width, middle width, bottom width, and the like), height, sidewall angle, and the like.

With reference to FIG. 3, optical metrology tool 310 can be used to measure the critical dimensions. In the present exemplary embodiment, optical metrology tool 310 preferably measures the critical dimensions with an error of less than 1 nanometer, and more preferably less than 0.2 or 0.3 nanometers. In general, optical metrology involves directing an incident beam at a structure, measuring the resulting diffracted beam, and analyzing the diffracted beam to determine various characteristics, such as the critical dimensions, of the structure. For a more detailed description of optical metrology, see U.S. patent application Ser. No. 09/907,488, titled GENERATION OF A LIBRARY OF PERIODIC GRATING DIFFRACTION SIGNALS, filed on Jul. 16, 2001; U.S. patent application Ser. No. 09/923,578, titled METHOD AND SYSTEM OF DYNAMIC LEARNING THROUGH A REGRESSION-BASED LIBRARY GENERATION PROCESS, filed on Aug. 6, 2001; and U.S. patent application Ser. No. 10/608, 300, titled OPTICAL METROLOGY OF STRUCTURES FORMED ON SEMICONDUCTOR WAFERS USING MACHINE LEARNING SYSTEMS, filed on Jun. 27, 2003, all of which are incorporated herein by reference in their entirety.

With continued reference to FIG. 3, in the present exemplary embodiment, one or more of the developer tool process variables of developer tool 306 are adjusted based on the critical dimensions of the structures measured at the plurality of locations on the wafer. In particular, the developer tool process variables are adjusted to compensate for non-uniformity in the profile of critical dimension measurements across the wafer.

For example, if the measured critical dimensions were high in the center of the wafer and low in the edge of the wafer, then one or more of the developer tool process variables are adjusted to produce critical dimensions that are low in the center of the wafer and high in the edge of the wafer in developer tool 306. Thus, when the wafer is then processed in etch tool 308, uniform critical dimensions are produced across the wafer.

In one exemplary embodiment, the process of developing photoresist using developer tool 306, etching the film layer using etch tool 308, measuring critical dimensions of structures using optical metrology tool 310, and adjusting one or more developer tool process variables can be repeated for any number of additional wafers until the critical dimensions measured on a wafer are uniform within an acceptable criterion. When an acceptable uniformity in critical dimensions is obtained, additional wafers are processed using developer tool 306 and etch tool 308 without adjusting the developer tool process variables of developer tool 306. Critical dimensions of structures on wafers can continue to be measured using optical tool 310 to continue to monitor the process. To increase throughput, critical dimension can be measured on wafers at established intervals of time or number of wafers processed.

Figure 4:
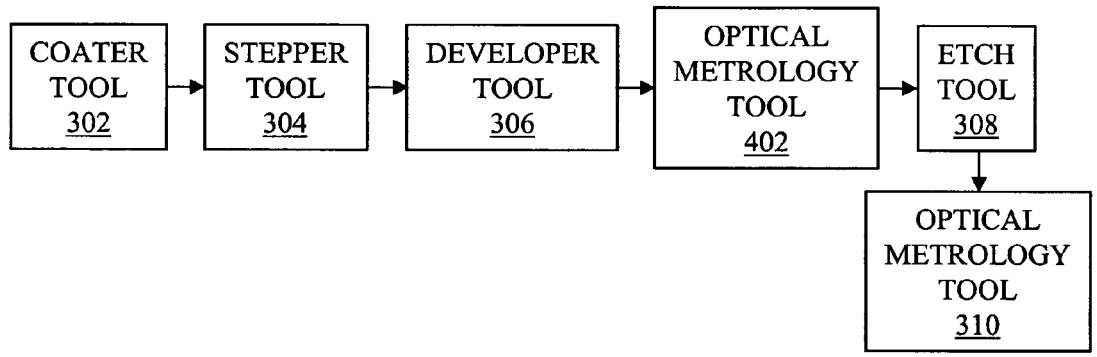

With reference to FIG. 4, in one exemplary embodiment, another metrology tool 402 is used to measure critical dimensions after a wafer has been processed in developer tool 306 and before being processed by etch tool 308. The measurements obtained by metrology tool 402 provide a profile of the variation in critical dimensions across a wafer before being processed in etch tool 308. The change in the profile of the variation in critical dimensions measured by optical metrology tools 402 and 310 can be used to determine the non-uniformity associated with etch tool 308.

It should be noted that optical metrology tools 402 and 310 can be stand-alone tools. Alternatively, optical metrology tools 402 and 310 can be integrated tools. For example optical metrology tool 402 can be integrated into developer tool 306, and optical metrology tool 310 can be integrated into etch tool 308. Also, rather than using two optical metrology tools 402 and 310, it should be noted that a single stand-alone optical metrology tool can be used to obtain critical dimension measurements after one or more wafers are processed in developer tool 306 and after etch tool 308.

Figure 5:
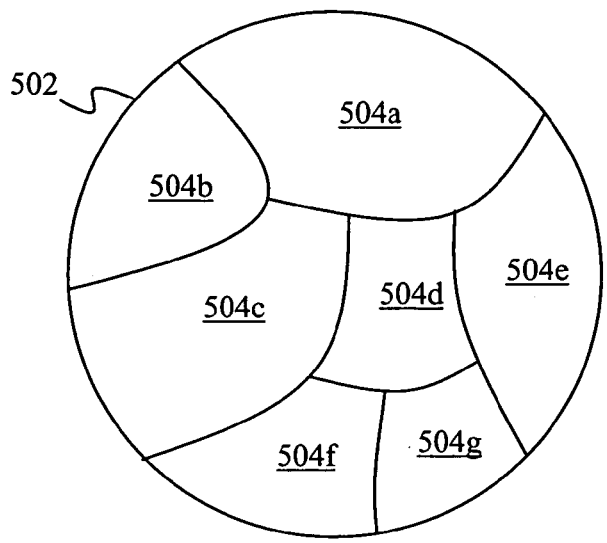
FIG. 5 depicts an exemplary hot plate in an exemplary developer tool.

With reference to FIG. 5, in one exemplary embodiment, developer tool 402 (FIG. 3) includes a hot plate 502, which is used to heat a wafer during post exposure bake. As depicted in FIG. 5, hot plate 502 can include a plurality of zones 504a-504g with each zone having a separate temperature setting. Although hot plate 502 is depicted as having seven zones, it should be noted that hot plate 502 can have any number of zones.

Figure 6:
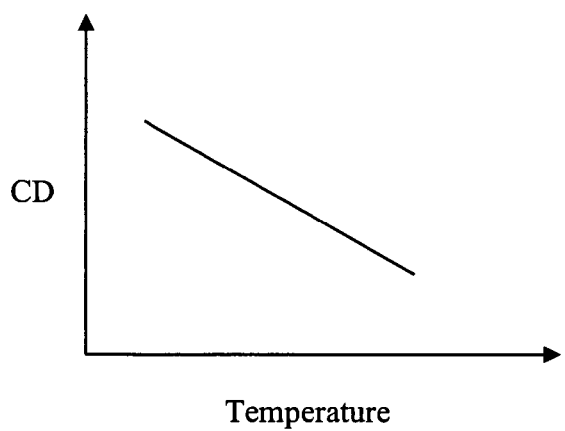
FIG. 6 is an exemplary graph depicting a relationship between critical dimensions and temperature.

The separate temperature setting of zones 504a-504g allow for different regions of the wafer to be heated to different temperatures. As depicted in FIG. 6, in general, increasing the temperature decreases the critical dimension of the structures formed on the wafer. Thus, the profile of the critical dimensions of the structures across the wafer can be adjusted by adjusting the temperature settings of zones 504a-504g (FIG. 5).

Figure 7:
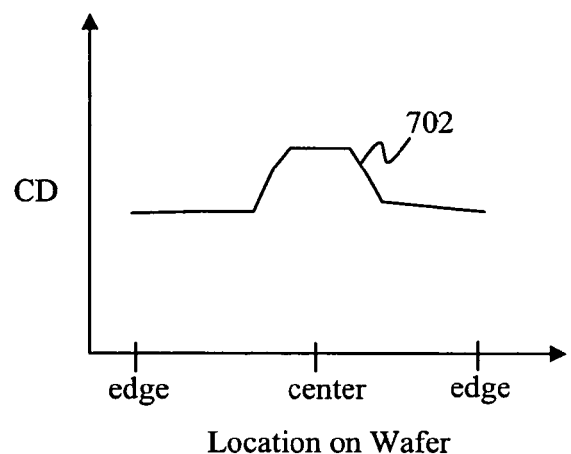
FIG. 7 is an exemplary graph depicting an exemplary profile of variation in critical dimensions across a wafer.

For example, with reference to FIG. 7, assume that profile 702 depicts the profile of critical dimensions across a wafer after the wafer has been processed in etch tool 308 (FIG. 3). As noted earlier, etch tools tend to produce structures with higher critical dimensions in the center of the wafer than the edge of the wafer. Thus, in this example, to compensate for the non-uniformity of profile 702, the temperature settings of zones 504a-504g (FIG. 5) in developer tool 306 (FIG. 3) can be adjusted to generate a profile of critical dimensions across the wafer after being processed in developer tool 306 (FIG. 3) that is an inverse of profile 702. In particular, with reference to FIG. 5, the temperature settings of zones 504a-504g near the center of the wafer can be increased relative to the temperature settings of zones 504a-504g near the edge of the wafer. One advantage to adjusting the development process in development tool 306 (FIG. 3) to compensate for non-uniformities in critical dimensions across a wafer produced by etch tool 308 (FIG. 3) is that the development process in development tool 306 (FIG. 3) typically can be better controlled than the etch process in etch tool 308 (FIG. 3).

The foregoing descriptions of specific embodiments have been presented for purposes of illustration and description. They are not intended to be exhaustive or to limit the invention to the precise forms disclosed, and it should be understood that many modifications and variations are possible in light of the above teaching.

We claim:

1. A method of controlling the critical dimensions of structures formed on a wafer, comprising:
   a) developing photoresist on top of a film layer on a wafer using a developer tool, the photoresist development being a function of developer tool process variables including temperature and length of time of development, wherein the wafer is heated by a hot plate in the developer, the hot plate having zones with each zone having a separate temperature setting;
   b) after a), performing one or more etching steps on the film layer on the wafer using an etch tool;
   c) after b), obtaining diffraction signals of structures at a plurality of locations on the wafer using an optical metrology tool;
   d) after c), generating a profile of critical dimension measurements of the structures across the wafer using the diffraction signals obtained in c); and
   e) adjusting the separate temperature settings of two or more of the zones of the hot plate based on the generated profile of critical dimension measures of the structures across the wafer.

2. The method of claim 1, wherein steps a) to e) are iterated for additional wafers, and wherein step e) is omitted when the profile of critical dimension measurements is uniform within an acceptable criterion.

3. The method of claim 1, wherein e) includes:
   adjusting the separate temperature settings of two or more of the zones of the hot plate to produce a profile of critical dimensions of structures formed in the photoresist after a) that is an inverse of the generated profile.

4. The method of claim 1, further comprising:
   after a), obtaining diffraction signals of structures formed in the photoresist using another optical metrology tool and determining critical dimensions of the structures using the diffraction signals.

5. The method of claim 4, wherein the another optical metrology tool is integrated with the developer tool.

6. The method of claim 1, wherein the optical metrology tool is integrated with the etch tool.

7. The method of claim 1, wherein the optical metrology tool determines the critical dimension in d) with an error of less than 1 nanometer.

8. The method of claim 7, wherein the optical metrology tool determines the critical dimension in d) with an error of less than 0.2 or 0.3 nanometer.

9. The method of claim 1, wherein adjusting the temperature settings includes:
   when the critical dimensions of structures measured at locations near the center of the wafer is larger than the critical dimensions of structures measures at locations near the edge of the wafer, increasing the temperature settings of zones of the hot plate near the center of the wafer relative to the temperature settings of zones of the hot plate near the edge of the wafer.

10. A method of controlling the critical dimensions of structures formed on a wafer, comprising:
    a) developing photoresist on top of a film layer on a wafer using a developer tool, the photoresist development being a function of developer tool process variables including temperature and length of time of development, wherein the wafer is heated by a hot plate in the developer, the hot plate having zones with each zone having a separate temperature setting;
    b) after a), obtaining diffraction signals of structures at a plurality of locations on the wafer using an optical metrology tool;
    c) after b), generating a profile of critical dimension measurements of the structures across the wafer using the diffraction signals obtained in b); and
    d) adjusting the separate temperature settings of two or more of the zones of the hot plate based on the generated profile of critical dimension measures of the structures across the wafer.

11. The method of claim 10, wherein steps a) to d) are iterated for additional wafers, and wherein step d) is omitted when the profile of critical dimension measurements is uniform within an acceptable criterion.

12. The method of claim 10, wherein d) includes:
    when the critical dimensions of structures measured at locations near the center of the wafer is larger than the critical dimensions of structures measures at locations near the edge of the wafer, increasing the temperature settings of zones of the hot plate near the center of the wafer relative to the temperature settings of zones of the hot plate near the edge of the wafer.

13. The method of claim 10, wherein d) includes:
    adjusting the separate temperature settings of two or more of the zones of the hot plate to produce a profile of critical dimensions of structures formed in the photoresist after a) that is inverse of the generated profile.

14. A method of controlling the critical dimensions of structures formed on a wafer, comprising:
    a) coating photoresist on top of a film layer on a wafer using a coater tool;
    b) exposing the photoresist to light to transfer patterns of structure to the photoresist using a stepper tool;
    c) developing the photoresist using a developer tool, wherein the wafer is heated by a hot plate in the developer, the hot plate having zones with each zone having a separate temperature setting;
    d) after c), etching the film layer on the wafer using an etch tool;
    e) after d), obtaining diffraction signals of structures at a plurality of locations on the wafer using an optical metrology tool;
    f) after e), generating a profile of critical dimension measurements of the structures across the wafer using the diffraction signals obtained in e); and g) adjusting the separate temperature settings of two or more of the zones of the hot plate based on the generated profile of critical dimension measures of the structures across the wafer.

15. A system to control the critical dimensions of structures formed on a wafer, comprising:
   a developer tool to develop photoresist on top of a film layer on a wafer, the developer tool being controlled by one or more developer tool process variables, wherein the wafer is heated by a hot plate in the developer, the hot plate having zones with each zone having a separate temperature setting;
   an etch tool to etch the film layer after the photoresist has been developed in the developer tool; and
   a first optical metrology tool to obtain the diffraction signals used to generate a profile of critical dimension measurements of structures across the wafer after the film layer has been etched in the etch tool,
   wherein the separate temperature settings of two or more of the zones of the hot plate are adjusted based on the generated profile of critical dimension measures of the structures across the wafer.

16. The system of claim 15, wherein additional wafers are processed in the developer and etch tools and measured by the first optical metrology tool obtains the diffraction signals used to generate a profile of critical dimension measurements of the structures across the wafers, and wherein the separate temperature settings of two or more of the zones of the hot plate are adjusted until the critical dimensions measured by the first optical metrology tool on a wafer are uniform within an acceptable criterion.

17. The system of claim 15, further comprising:
   a second optical metrology tool to obtain the diffraction signals used to generate a profile of critical dimension measurements of structures formed in the photoresist in the developer tool.

18. The system of claim 17, wherein the second optical metrology tool is integrated with the developer tool.

19. The system of claim 15, wherein the first optical metrology tool is integrated with the etch tool.

20. The system of claim 15 wherein the first optical metrology tool determines the critical dimension with an error of less than 1 nanometer.

21. The system of claim 20, wherein the first optical metrology tool determines the critical dimension with an error of less than 0.2 or 0.3 nanometer.

22. The system of clam 15, wherein the etch tool is a plasma etch tool.

23. The system of claim 15, wherein when the critical dimensions of structures measured at locations near the center of the wafer is larger than the critical dimensions of structures measures at locations near the edge of the wafer, the temperature settings of zones of the hot plate near the center of the wafer are increased relative to the temperature settings of zones of the hot plate near the edge of the wafer.

24. The system of claim 15, wherein the temperature setting of one or more of the zones of the hot plate is adjusted to produce a profile of critical dimensions of structures formed in the photoresist in the developer tool that is an inverse of a profile of critical dimension measurements across a wafer measured by the first optical metrology tool.

* * * * *